United States Patent
Pawletko et al.

(10) Patent No.: US 6,545,912 B1
(45) Date of Patent: Apr. 8, 2003

(54) ERASE VERIFY MODE TO EVALUATE NEGATIVE $V_T$'S

(75) Inventors: Joseph G. Pawletko, Germantown, MD (US); Shane C. Hollmer, San Jose, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 138 days.

(21) Appl. No.: 09/727,656

(22) Filed: Nov. 30, 2000

Related U.S. Application Data

(60) Provisional application No. 60/199,645, filed on Apr. 25, 2000.

(51) Int. Cl.[7] .............................................. G11C 16/06
(52) U.S. Cl. ........................ 365/185.22; 365/185.24; 365/185.18
(58) Field of Search ................. 365/185.22, 185.29, 365/185.17, 185.18, 185.24, 185.33, 189.02, 230.02, 210

(56) References Cited

U.S. PATENT DOCUMENTS 5,172,338 A * 12/1992 Mehrotra et al. ........... 365/185
5,608,671 A * 3/1997 Ninomiya ............... 365/185.29
5,959,887 A * 9/1999 Takashina et al. ...... 365/185.11

FOREIGN PATENT DOCUMENTS

JP    405182483 A  *  7/1993  ........... G11C/16/06

* cited by examiner

*Primary Examiner*—David Lam
(74) *Attorney, Agent, or Firm*—Farjami & Farjami LLP

(57) ABSTRACT

A method is provided to determine erase threshold voltages of memory transistors and thereby identify unusable memory transistors. A voltage is applied to the common source of a selected memory transistor and gradually incremented until a logical HIGH bit is read as a logical LOW bit. By iteratively incrementing $V_{bias}$, the erase threshold voltage for each memory transistor can be determined. In one process, the erase threshold voltage for each memory transistor in a memory device is determined and then the memory device is put under stress tests to simulate normal operative conditions. After the stress tests, the erase threshold voltage of each memory transistor can be once again determined to ascertain the change in the erase threshold voltage, i.e., the data retention characteristic, of each memory transistor.

14 Claims, 4 Drawing Sheets

US 6,545,912 B1

ERASE VERIFY MODE TO EVALUATE NEGATIVE $V_T$'S

This application claims the benefit of provisional application No. 60/199,645, filed Apr. 25, 2000.

FIELD OF THE INVENTION

The present invention is directed to memory devices and more particularly to testing of memory cells.

BACKGROUND

FIG. 1 illustrates a cross sectional view of a conventional flash memory transistor, also known as a flash memory cell. The memory transistor includes a control gate CG, a floating gate FG, a drain D, a source S, and a well W. Thin oxide layers isolate the floating gate FG from the control gate CG as well as the well W.

FIG. 2 schematically illustrates a conventional NAND type flash memory array 200 that includes flash memory transistors, each of which can be implemented by the flash memory transistor depicted in FIG. 1. A string $K_i$ (where i can be any number) includes a selection transistor $T_{i-1}$, memory transistors $M_{i-1}$ to $M_{i-j}$ (where j can be any number), and a selection transistor $T_{i-2}$, all being serially coupled. String $K_i$ can be coupled to a bit line $B_i$ and a common source CS through selection transistors $T_{i-1}$ and $T_{i-2}$, respectively. The control gates for selection transistors $T_{i-1}$ and $T_{i-2}$ are respectively connected to selection lines $Sl_1$ and $Sl_2$. The control gates for the memory transistors $M_{i-1}$ to $M_{i-j}$ are respectively connected to word lines $W_1$ to $W_j$.

A flash memory transistor represents logical LOW (a logic state) when it is programmed, i.e., having a threshold voltage that is larger than a predetermined minimum threshold voltage for logical LOW bits (e.g., 0.5 V). A memory transistor represents a logical HIGH (also a logic state) when it is erased, i.e., having a threshold voltage that is less than a predetermined maximum threshold voltage for logical HIGH bits (e.g., −0.7 V).

A memory transistor connected to a word line can be programmed to represent logical LOW by applying a programming voltage (e.g., 16 V to 20 V) to the word line and applying a ground to the source, the drain, and the well of the memory transistor. The programming voltage causes charge to deposit on the floating gate FG of the memory transistor through the Fowler-Nordheim ("FN") tunneling phenomenon, thereby raising its threshold voltage. Conversely, a memory transistor connected to a word line can be erased to represent logical HIGH by applying a ground to the word line and applying an erase voltage (e.g., 19 to 20 V) to the well of the memory transistor. The drain and source junctions will couple up to the well potential minus a diode drop (e.g., 18.3 to 19.3 V). The erase voltage causes charge to be removed from the floating gate of the memory transistor through the FN tunneling phenomenon, thereby lowering its threshold voltage. The threshold voltage of a logical HIGH bit is hereinafter referred to as "erase $V_t$".

A flash memory transistor connected to a selected word line and a selected bit line can be read by applying a voltage to the selection transistors (e.g., 4 V), unselected word lines (e.g., 4 V), and a ground to the selected word line and the common source. A current is allowed to flow in the bit line during the evaluation period. If the bit line potential increases above the trip-point of a sensing circuit (e.g., a data-latch in combination with a cascode device), the memory transistor is read as a logical LOW. If the bit line potential stays below the trip-point of the sensing circuitry, then the memory transistor is read as a logical HIGH.

The market for flash memory devices demands manufacturers to guarantee a data retention rate for their products (e.g., data retention for 10 years at 85° C.). Unfortunately, a memory transistor erased to represent a logical HIGH bit can collect charge on its floating gate under normal operations over time, thereby gaining a higher threshold voltage. This memory transistor will corrupt the stored data if its threshold voltage shifts high enough to be read as a logical LOW bit. To prevent data corruption, the manufacturers can use a large read margin, i.e., a large difference in threshold voltages, between logical LOW and logical HIGH bits. A large read margin can prevent data corruption by allowing erased memory transistors to gain slightly higher threshold voltages over time without being read as logical LOW bits. However, process variations can cause a small number of memory transistors to perform poorly over a relatively short period of time. These memory transistors can gain higher threshold voltages too quickly under normal operations and thereby corrupting the stored data prior to the end of the manufacturers' guarantee.

Accordingly, there is a need for a method and an apparatus that determines erase $V_t$'s of memory transistors and the changes in erase $V_t$'s of memory transistors to identify unusable memory transistors.

SUMMARY

The present invention provides a method and an apparatus that determine erase $V_t$'s of erased flash memory transistors. The present invention also provides a method and an apparatus that identify erased memory transistors with poor data retention characteristics using the erase $V_t$'s. In accordance with one embodiment of the present invention, a voltage $V_{bias}$ is applied to the common source and gradually increased until a logical HIGH bit is read as a logical LOW bit. If a memory transistor is read as a logical HIGH bit while $V_{bias}$ is applied to the common source, i.e., if the memory transistor conducts a current, then the erase $V_t$ of that memory transistor is less than $-V_{bias}$. If a memory transistor is read as a logical LOW bit while $V_{bias}$ is applied, i.e., if the memory transistor does not conduct, then the erase $V_t$ of that memory transistor is greater than $-V_{bias}$. Thus, by iteratively increasing $V_{bias}$, the erase $V_t$ of each memory transistor can be determined. Once the erase $V_t$ of each flash memory transistor in a flash memory device is determined, the flash memory device can be put under stress tests to simulate normal operative conditions. After the stress tests, the erase $V_t$ of each memory transistor can be once again determined to ascertain the change in the erase $V_t$ (i.e., the data retention characteristic, of each memory transistor).

BRIEF DESCRIPTION OF THE DRAWINGS

Note that use of the same reference numbers in different figures indicates the same or like elements.

DETAILED DESCRIPTION

Figure 1:
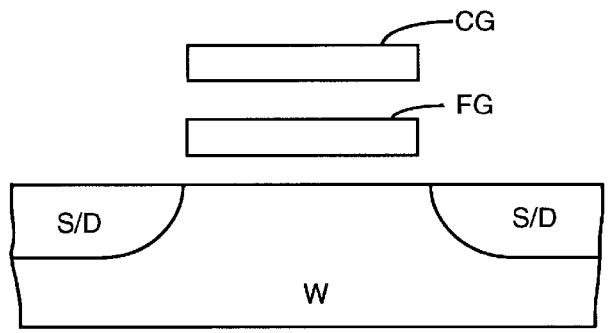
FIG. 1 illustrates a cross sectional view of a conventional memory transistor.
Figure 2:
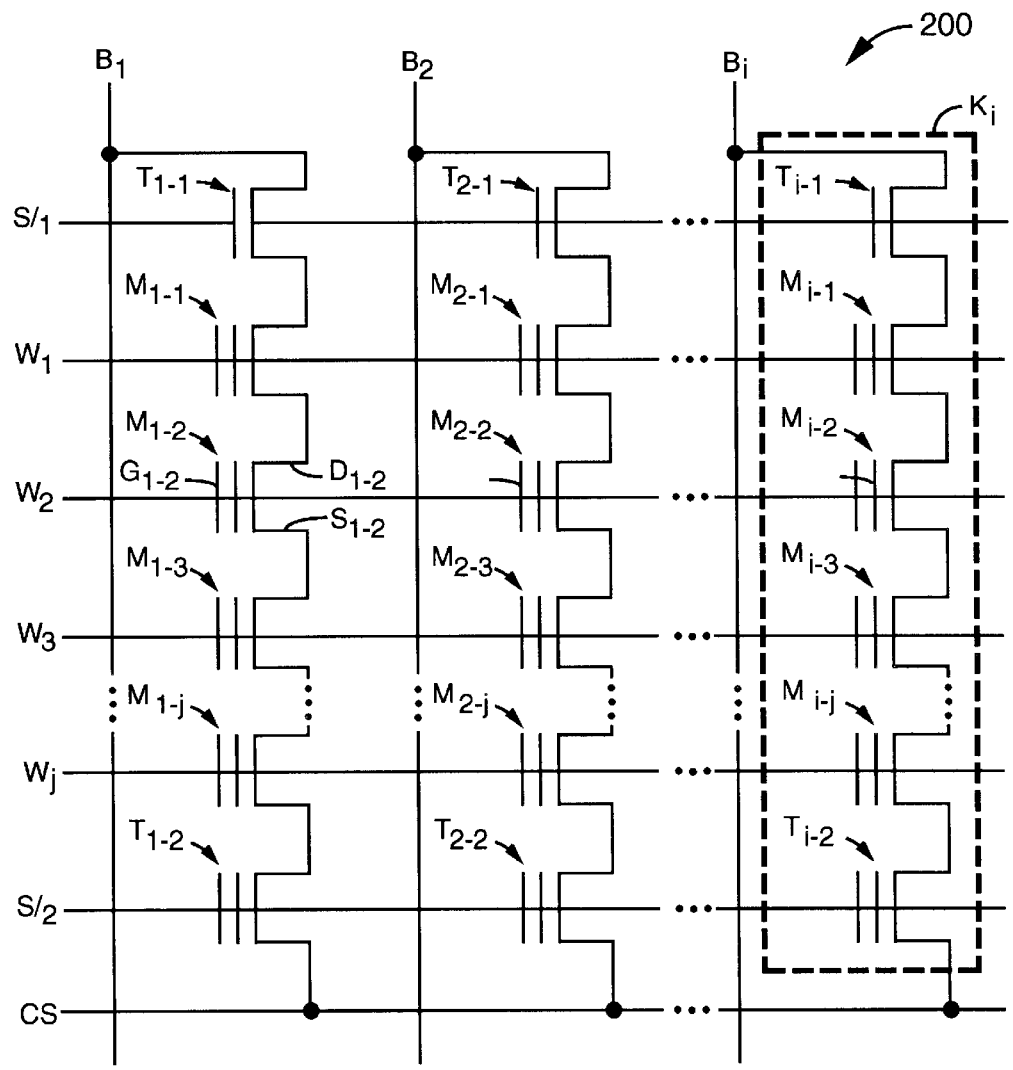
FIG. 2 illustrates a schematic of a conventional emory array in a NAND type flash memory device.
Figure 3A:
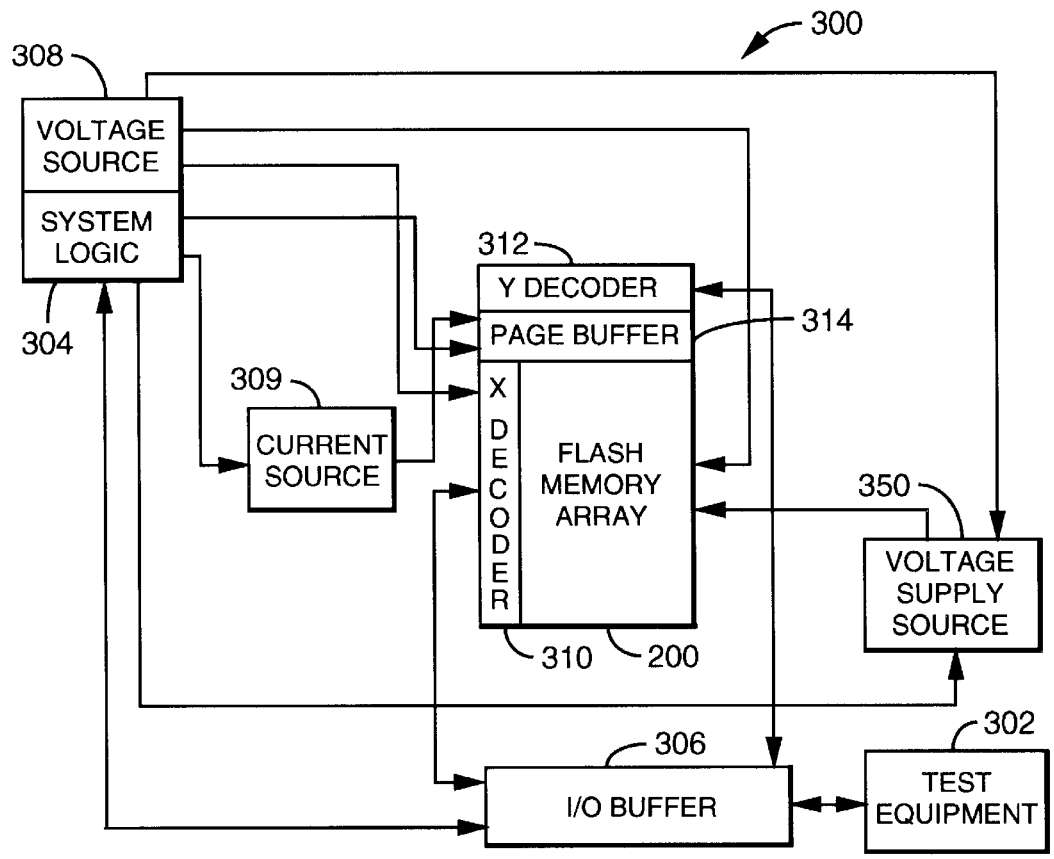
FIG. 3A illustrates a schematic of a memory system 300 in accordance with an embodiment of the present invention.

FIG. 3A schematically depicts a suitable memory system 300 used in process 400 (FIG. 4), an embodiment of the present invention described in more detail later. Memory system 300 includes a test equipment 302, a system logic 304, an I/O buffer 306, a voltage source 308, a current source 309, a X-decoder 310, a Y-decoder 312, a page buffer 314, and a voltage supply circuit 350. An example of test equipment 302 is the Hewlett-Packard V3308 or Advantest T5334 or any other suitable memory test system. System logic 304 includes hardwired logic that operates memory system 300. I/O buffer 306 is a conventional input/output signal transfer device. Voltage source 308 is a conventional charge pump. Current source 309 is a conventional current source. X-decoder 310 is a conventional decoder device that selects a word line associated with an input address from I/O buffer 306. Y-decoder 312 is a conventional decoder device that selects a page buffer associated with an input address from I/O buffer 306. Page buffer 314 is a conventional buffer that loads signals into memory array 200 (FIG. 2). Voltage supply circuit 350 is a circuit that selects a source of voltage between voltage source 308 and test equipment 302 for common source CS (FIG. 2).

In this embodiment, memory system 300 operates in either a "test" mode or a "user" mode. In one embodiment of the test mode hereinafter referred to as "Erase Vt Mode", a voltage $V_{bias}$ is used to determine the erase $V_t$'s of memory transistors. In accordance with another embodiment of the present invention, the Erase $V_t$ Mode is used to measure changes in the erase $V_t$'s of the memory transistors prior to and after stress tests to determine data retention characteristics of each memory transistor. The user engages Erase $V_t$ Mode through test equipment 302 interfacing with system logic 304 through I/O buffer 306.

Figure 3B:
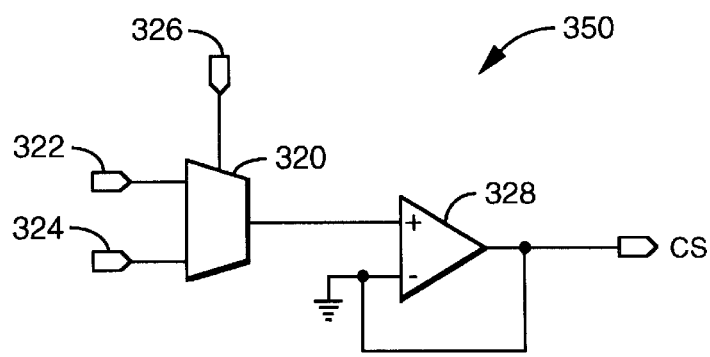
FIG. 3B illustrates a block diagram of a voltage supply circuit in accordance with an embodiment of the present invention.

FIG. 3B illustrates a block diagram of a voltage supply circuit 350 in accordance with one embodiment. Voltage supply circuit 350 is used in process 400, described in more detail later. Multiplexor ("MUX") 320 couples common source CS (FIG. 2) to an internal voltage source 322 or an external voltage source 324. In this embodiment, internal voltage source is voltage source 308 and external voltage source 324 is test equipment 302 providing voltage $V_{bias}$. MUX 320 is controlled by a signal 326 from system logic 304. In this embodiment, a unity gain buffer 328 is connected to the common source CS to maintain a constant voltage at the common source CS regardless of current. In Erase $V_t$ Mode, the large number of memory transistors that are turned on can result in a large current at the common source CS. Unity gain buffer 328 ensures that a large current will not affect $V_{bias}$ set at the common source CS.

Figure 4:
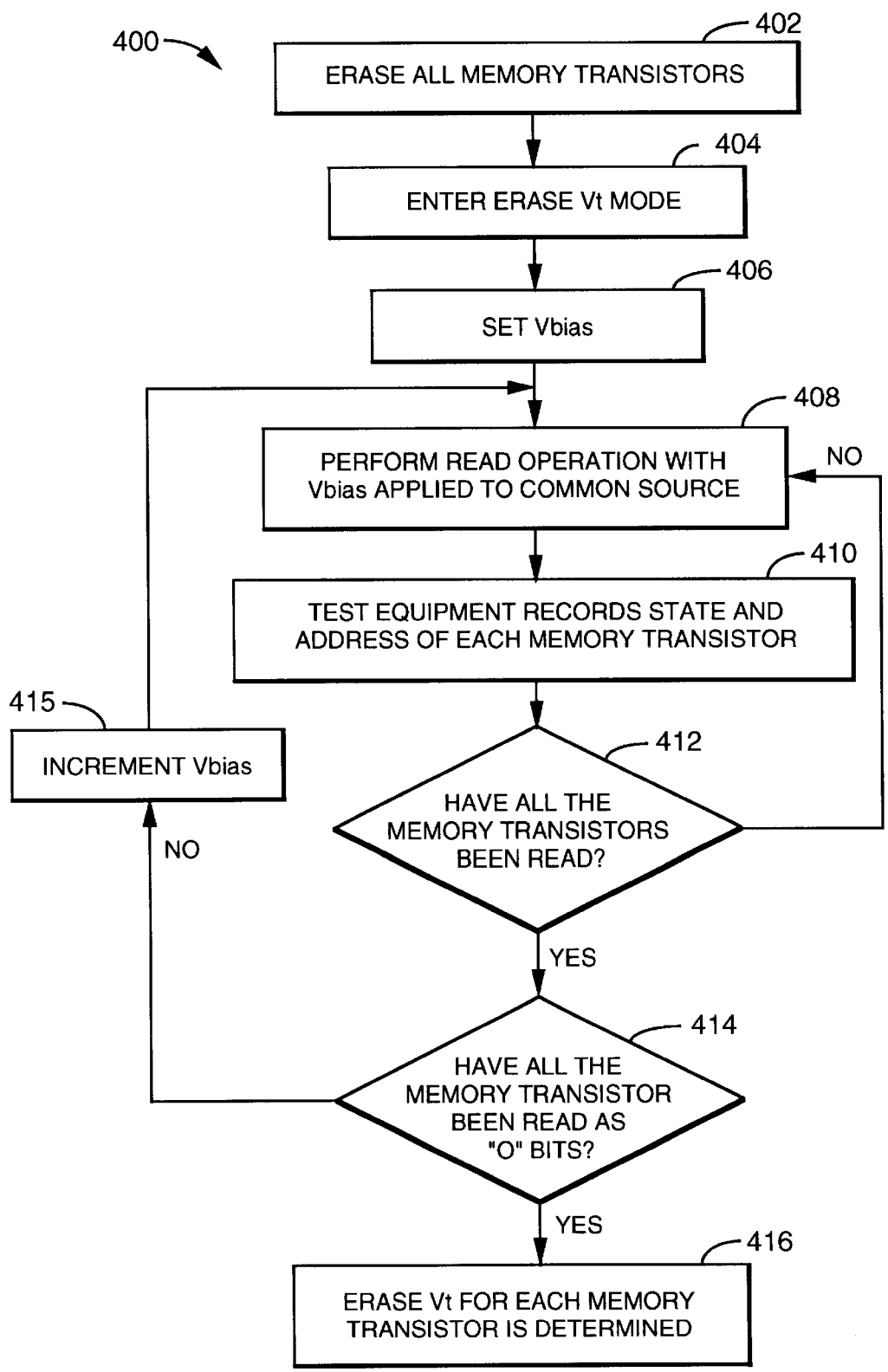
FIG. 4 illustrates a flow chart of a method used to determine erase $V_t$'s.

FIG. 4 illustrates a suitable Erase $V_t$ Mode process 400 in accordance with one embodiment of the present invention. In action 402, all memory transistors in memory array 200 are erased to represent logical HIGH bits. In action 404, the user engages the Erase $V_t$ Mode through the use of test equipment 302. In action 406, the user selects a $V_{bias}$ through test equipment 302. In action 408, voltage source 308 applies a ground to a selected word line and a positive voltage (e.g., 4 V) to the unselected word lines and the selection transistor lines. Also in action 408, current source 309 supplies a current that flows in the bit lines. Furthermore, in action 408, system logic 302 sends signal 326 to MUX 320 so that test equipment 302 can apply the selected $V_{bias}$ (FIG. 3B) (e.g., 0 to 3.5 V) to the common source CS.

As presented, a memory transistor connected to the selected word line is read as a logical HIGH bit if $-V_{bias}$ is greater than its erase $V_t$ because the voltage from its control gate to its source ($V_{gs}$) is equal to $-V_{bias}$. Conversely, a memory transistor connected to the selected word line is read as a logical LOW bit if $-V_{bias}$ is less than its erase $V_t$. In action 408, all memory transistors connected to the selected word line are read at once (also known as a "page read").

In action 410, the state and address of each memory transistor read in action 408 are stored in page buffer 314 and output to a memory storage device of test equipment 302. Action 412 repeats actions 408 and 410 until all memory transistors are read. In action 414, if all the memory transistors have not been read as logical LOW bits, actions 408, 410, and 412 are repeated with a higher $V_{bias}$ set in action 415. $V_{bias}$, for example, may be increased in increments of 0.05 V or less. If all the memory transistors have been read as logical LOW bits, action 414 is followed by action 416, where the erase $V_t$ for each memory transistor is determined.

After all of the memory transistors have been read as logical LOW bits, the user can use the recorded states and addresses of the memory transistors at the incremented $V_{bias}$'s to determine the erase $V_t$ of each memory transistor. With each increment of $V_{bias}$, more transistors are read as logical LOW bits. The change of state of a memory transistor from a logical HIGH bit registered from a $V_{bias}$ to a logical LOW bit registered from a subsequent $V_{bias}$ indicates that the memory transistor has an erase $V_t$ between $-V_{bias}$ and the subsequent $-V_{bias}$. If desired, the increments of $V_{bias}$ can be narrowed for more accurate measurements of the erased $V_t$. To illustrate, the following example is provided.

In a first iteration with a $V_{bias}$ of 0.65 V, a memory transistor is read as a logical HIGH bit. This means that the memory transistor has an erase $V_t$ more negative than $-0.65$ V. In a second iteration with a $V_{bias}$ of 0.7 V, the memory transistor is read as a logical LOW bit. This means that the memory transistor has an erase $V_t$ between $-0.65$ V to $-0.7$ V. This example is illustrative only and does not limit the scope of the invention.

Furthermore, the distribution of the erase $V_t$'s of all the memory transistors in memory array 200 can be determined. The increase in the number of logical LOW bits registered from a $V_{bias}$ to a subsequent $V_{bias}$ indicates the number of memory transistors with erase $V_t$'s between $-V_{bias}$ and the subsequent $-V_{bias}$. As previously suggested, the increments of $V_{bias}$ can be narrowed to get more accurate measurements of the erased $V_t$'s. To illustrate, the following example is rovided.

In a first iteration with a $V_{bias}$ of 0.65 V, 0% of the memory transistors are read as logical LOW bits. This means that none of the memory transistors have erase $V_t$'s greater than $-0.65$ V. In a second iteration with a $V_{bias}$ of 0.7 V, 15% of the memory transistors are read as logical LOW bits. This means that 15% of the memory transistors have erase $V_t$'s between $-0.65$ V to $-0.7$ V. This example is illustrative only and does not limit the scope of the invention.

Figure 5:
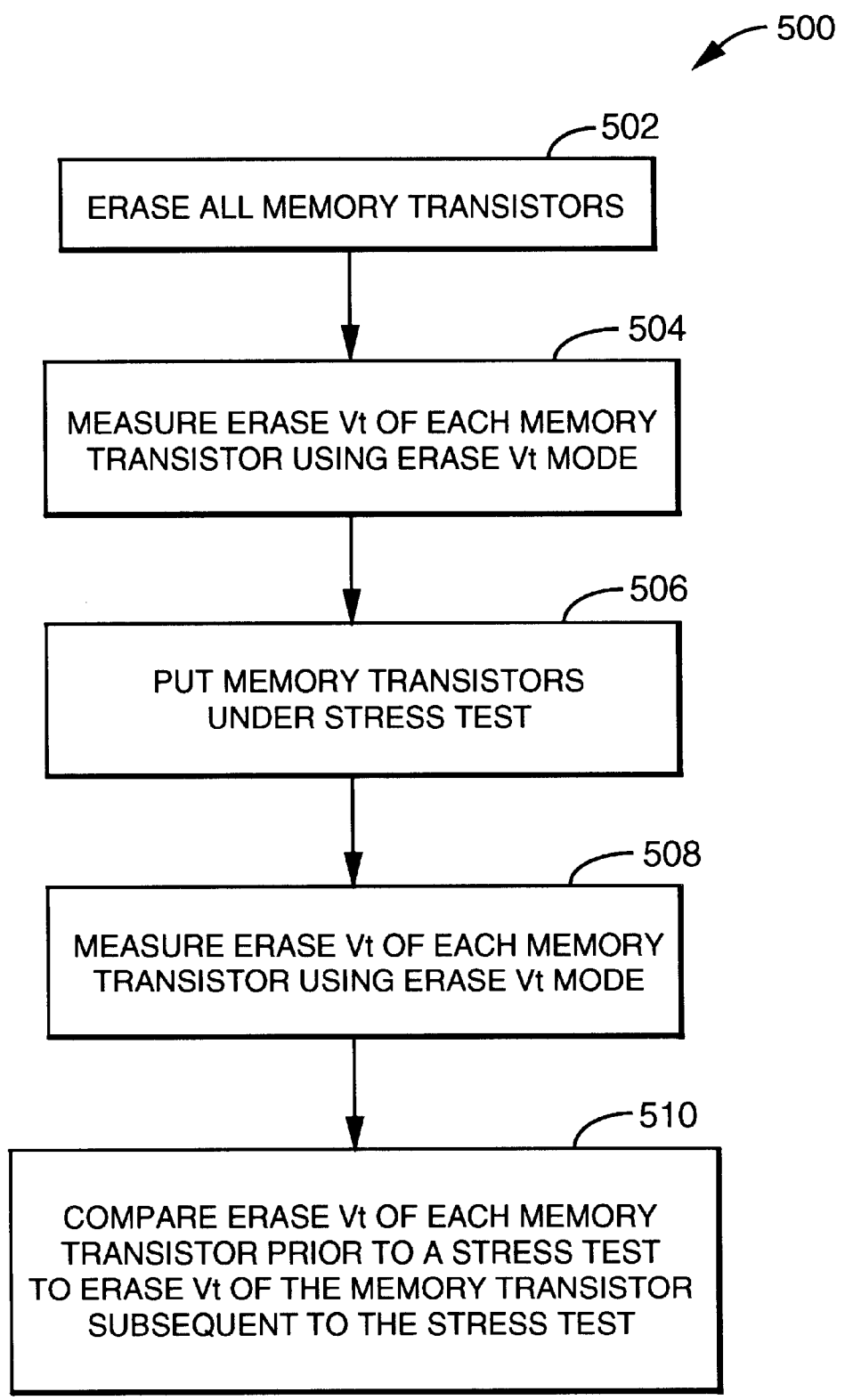
FIG. 5 illustrates a flow chart of a method used to determine data retention characteristics.

FIG. 5 illustrates a suitable process 500 in accordance with another embodiment of the present invention. Process 500 uses Erase $V_t$ Mode to identify memory transistors having undesirable data retention characteristics so these memory transistors may be marked as unusable. In action 502, all memory transistors in memory array 200 are erased to represent logical HIGH bits. In action 504, the address and erase $V_t$ of each memory transistor in memory device 200 are determined and recorded by process 400 described above and in FIG. 4. In action 506, memory device 200 undergoes a stress test. Stress tests for example may be a bake test, where memory devices are baked in ovens, and a voltage stress test, where voltages are repeatedly applied to the word lines to simulate repeated read operations. In action 508, the erase Vt of each memory transistor in memory array 200 is once again determined. In action 510, the erase $V_t$ of each memory transistor prior to the stress test is compared to the erase $V_t$ of the memory transistor subsequent to the stress test. If the erase $V_t$ of a memory transistor has undergone an undesirable amount of change, e.g., more than 0.5 V of change, that memory transistor can be identified as unusable. Once a memory transistor has been identified as unusable, it is examined to further understand its behavior. From this understanding, various test modes, including processes 400 and 500, can be used to screen similar bits in mass production, thus guaranteeing quality and reliability.

Although the present invention has been described in considerable detail with reference to certain versions thereof, other versions are possible. Therefore, the spirit and scope of the appended claims should not be limited to the description of the versions depicted in the figures.

What is claimed is:

1. A method for identifying a first threshold voltage of a memory transistor having a source terminal comprising the acts of:
   erasing the memory transistor;
   applying a first voltage to the source terminal of the memory transistor;
   determining a first state of the memory transistor;
   applying a second voltage to the source terminal of the memory transistor;
   determining a second state of the memory transistor; and
   determining the first threshold voltage of the memory transistor using the first state and the second state of the memory transistor.

2. The method of claim 1, wherein the act of determining the first threshold voltage of the memory transistor comprises the act of comparing the first state and the second state of the memory transistor, wherein the first threshold voltage of the memory transistor is a voltage between the first voltage and the second voltage if the first state is different from the second state.

3. The method of claim 1, further comprising the acts of:
   recording the first threshold voltage;
   stressing the memory transistor;
   determining a second threshold voltage; and
   recording the second threshold voltage.

4. The method of claim 3, wherein the act of determining the first threshold voltage comprises the act of comparing the first state and the second state of the memory transistor, wherein the first threshold voltage of the memory transistor is a voltage between the first voltage and the second voltage if the first state is different from the second state.

5. The method of claim 4, wherein the act of determining the second threshold voltage comprises the act of:
   applying a third voltage to the source terminal of the memory transistor;
   determining a third state of the memory transistor;
   applying a fourth voltage to the source terminal of the memory transistor;
   determining a fourth state of the memory transistor; and
   comparing the third state and the fourth state of the memory transistor, wherein the second threshold voltage of the memory transistor is a voltage between the third voltage and the fourth voltage if the third state is different from the fourth state.

6. A method of determining unusable memory transistors comprising the acts of:
   determining a first threshold voltage of a memory transistor having a source terminal;
   stressing the memory transistor;
   determining a second threshold voltage of a memory transistor; and
   identifying whether the memory transistor is usable based on the first and second threshold voltages.

7. The method of claim 6, wherein the act of determine the first threshold voltage comprising the acts of:
   erasing the memory transistor;
   applying a first voltage to the source terminal of the memory transistor;
   determining a first state of the memory transistor;
   applying a second voltage to the source terminal of the memory transistor;
   determining a second state of the memory transistor; and
   determining the first threshold voltage of the memory transistor using the first state and the second state of the memory transistor, wherein the first threshold voltage of the memory transistor is a voltage between the first voltage and the second voltage if the first state is different from the second state.

8. The method of claim 7, wherein the act of determine the threshold voltage comprising the acts of:
   applying a third voltage to the source terminal of the memory transistor;
   determining a third state of the memory transistor;
   applying a fourth voltage to the source terminal of the memory transistor;
   determining a fourth state of the memory transistor; and
   determining the second threshold voltage of the memory transistor using the third state and the fourth state of the memory transistor, wherein the second threshold voltage of the memory transistor is a voltage between the third voltage and the fourth voltage if the third state is different from the fourth state.

9. A combination comprising:
   a memory array having a memory transistor, wherein the memory transistor has a source terminal; and
   a test equipment coupled to apply a first test voltage to the source terminal when the memory transistor is in an erased state; wherein the test equipment determines a resulting first state of the memory transistor; and wherein the test equipment applies a second test voltage to the source terminal and determines a resulting second state of the memory transistor and determines a threshold voltage of the memory transistor from the first and second states.

10. The combination of claim 9, further comprising a multiplexor coupled to the source terminal, wherein the multiplexor has inputs from an internal voltage source and the test equipment.

11. The combination of claim 6, wherein a unity gain buffer is coupled between the multiplexor and the source terminal.

12. The combination of claim 9, wherein a unity gain buffer is coupled between the test equipment and the source terminal.

13. A combination comprising:
a memory array having a memory transistor, wherein the memory transistor has a source terminal; and
a test equipment, wherein the test equipment applies a test voltage to the source terminal in a test mode, wherein a unity gain buffer is coupled between the test equipment and the source terminal.

14. A combination comprising:
a memory array having a memory transistor, wherein the memory transistor has a source terminal;
a test equipment, wherein the test equipment applies a test voltage to the source terminal in a test mode;
a multiplexor coupled to the source terminal, wherein the multiplexor has inputs from an internal voltage source and the test equipment; and
a unity gain buffer coupled between the multiplexor and the source terminal.

* * * * *